(12) United States Patent
Boire et al.

(10) Patent No.: US 9,853,684 B2
(45) Date of Patent: Dec. 26, 2017

(54) HIGH RADIATION EFFICIENCY ANTENNA SYSTEMS

(71) Applicant: BLACKBERRY LIMITED, Waterloo (CA)

(72) Inventors: Daniel Charles Boire, Nashua, NH (US); Jeffrey Schroeder, Nashua, NH (US); Gregory Mendolia, Nashua, NH (US)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 14/877,983

(22) Filed: Oct. 8, 2015

(65) Prior Publication Data

US 2016/0105212 A1  Apr. 14, 2016

Related U.S. Application Data

(60) Provisional application No. 62/061,745, filed on Oct. 9, 2014.

(51) Int. Cl.
| | |
|---|---|
| *H04B 1/00* | (2006.01) |
| *H04B 1/48* | (2006.01) |
| *H01Q 1/24* | (2006.01) |
| *H01Q 21/28* | (2006.01) |
| *H01Q 21/30* | (2006.01) |
| *H01Q 21/00* | (2006.01) |
| *H03H 7/40* | (2006.01) |
| *H04B 1/04* | (2006.01) |

(52) U.S. Cl.
CPC ............ *H04B 1/48* (2013.01); *H01Q 1/243* (2013.01); *H01Q 21/0006* (2013.01); *H01Q 21/28* (2013.01); *H01Q 21/30* (2013.01); *H03H 7/40* (2013.01); *H04B 1/0064* (2013.01); *H04B 1/0475* (2013.01); *H04B 2001/485* (2013.01)

(58) Field of Classification Search
CPC .......................... H04B 7/0404; H04B 1/0064
USPC ............................................ 455/575.7, 575.5
See application file for complete search history.

(56) References Cited

U.S. PATENT DOCUMENTS

| | | | | |
|---|---|---|---|---|
| 6,452,556 | B1* | 9/2002 | Ha | H01Q 1/243 343/700 MS |
| 9,431,717 | B1* | 8/2016 | Lee | H01Q 19/005 |
| 2006/0256024 | A1* | 11/2006 | Collinson | H01Q 5/00 343/770 |
| 2008/0268926 | A1* | 10/2008 | Black | H01Q 21/28 455/575.7 |
| 2011/0014958 | A1* | 1/2011 | Black | H01Q 1/243 455/575.7 |
| 2013/0322562 | A1* | 12/2013 | Zhang | H04B 7/0404 375/267 |

(Continued)

FOREIGN PATENT DOCUMENTS

| | | |
|---|---|---|
| GB | 2509302 A | 7/2014 |
| WO | 2014074129 A1 | 5/2014 |

*Primary Examiner* — Wen Huang
(74) *Attorney, Agent, or Firm* — Guntin & Gust, PLC; Atanu Das

(57) ABSTRACT

A system that incorporates teachings of the subject disclosure may include, for example, a communication device including a matching network for impedance tuning and pairs of antennas that can be utilized as primary and diversity antennas, respectively, and can provide high radiation efficiency. An RF switch can be utilized for re-configuring the primary and diversity antennas. Other embodiments are disclosed.

20 Claims, 20 Drawing Sheets

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| ⋮ |
| Band N; Use Case 1; Desired tuning state |
| Band N; Use Case 2; Desired tuning state |
| ⋮ |
| Band N; Use Case n; Desired tuning state |

(56) References Cited

U.S. PATENT DOCUMENTS

2014/0022132 A1   1/2014  Badaruzzaman et al.
2015/0044977 A1*  2/2015  Ramasamy .......... H04B 7/0404
                                                455/77
2015/0099474 A1*  4/2015  Yarga .................. H04B 1/0064
                                                455/77

* cited by examiner

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

HIGH RADIATION EFFICIENCY ANTENNA SYSTEMS

CROSS-REFERENCE TO RELATED APPLICATION(S)

This application claims priority to U.S. Provisional Patent Application Ser. No. 62/061,745 filed Oct. 9, 2014. All sections of the aforementioned application(s) are incorporated herein by reference in its entirety.

FIELD OF THE DISCLOSURE

The subject disclosure relates to high radiation efficiency antenna systems.

BACKGROUND

Modern wireless communication devices often utilize wide band antennas which are intended to cover a range of frequencies such as from 700 to 2700 MHz. Antenna design is made more challenging by handset requirements that include long battery life, more frequency bands, larger display screens with reduced borders, and thinner form factors.

Cellular communication devices such as cellular telephones, tablets, and laptops can support multi-cellular access technologies, peer-to-peer access technologies, personal area network access technologies, and location receiver access technologies, which can operate concurrently. Cellular communication devices have also integrated a variety of consumer features such as MP3 players, color displays, gaming applications, cameras, and other features. Cellular communication devices can be required to communicate at a variety of frequencies, and in some instances are subjected to a variety of physical and functional use conditions.

BRIEF DESCRIPTION OF THE DRAWINGS

Reference will now be made to the accompanying drawings, which are not necessarily drawn to scale, and wherein:

FIG. 7 depicts an illustrative embodiment of a look-up table utilized by the communication device of FIG. 1A-1F for controlling tunable reactive elements utilized by the communication device;

DETAILED DESCRIPTION

Figure 1A:
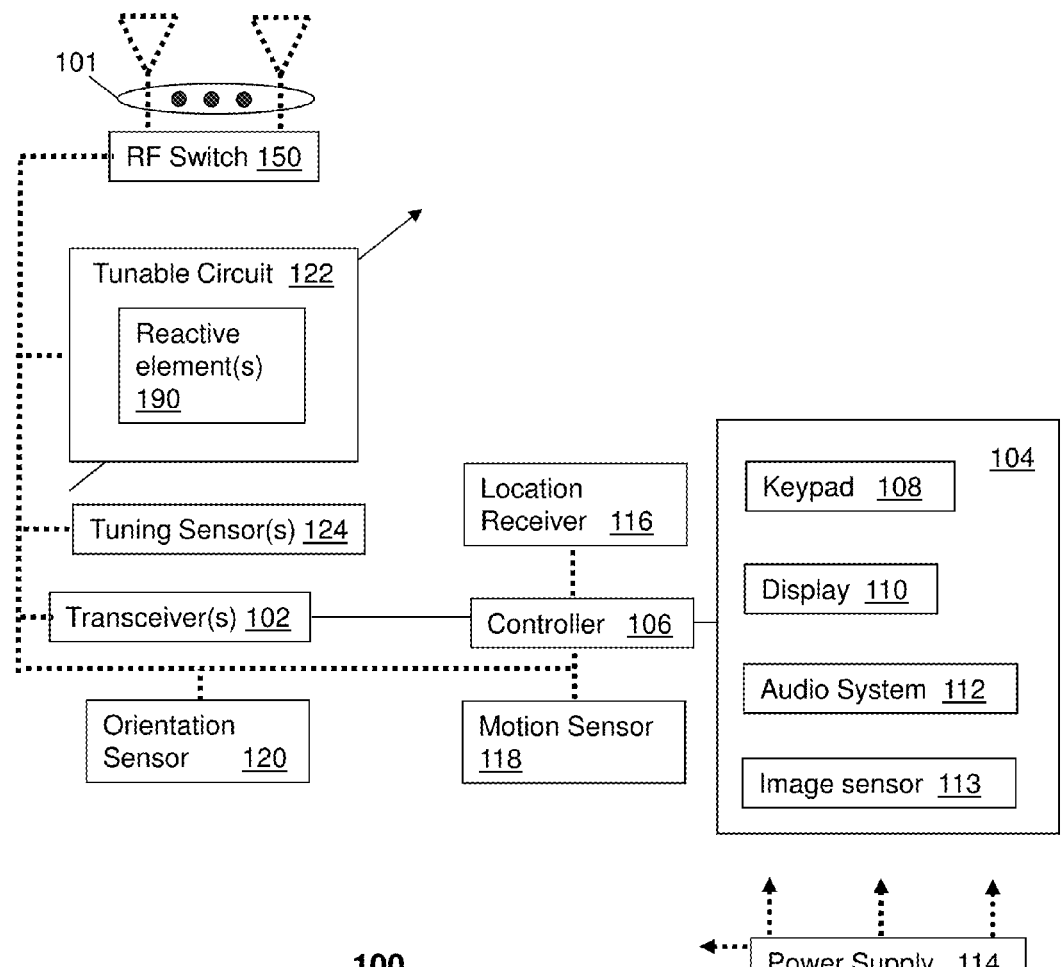
FIGS. 1A-1F depict an illustrative embodiment of a communication device that provides high radiation efficiency antennas in conjunction with impedance tuning.

The subject disclosure describes, among other things, illustrative embodiments of devices that utilize high radiation efficiency in conjunction with tunable RF matching technology to correct antenna mismatch loss. One or more of the embodiments, include a high efficiency antenna system including a primary and diversity antenna pair that utilizes dynamic antenna tuning for one or both of the antennas. The primary and diversity antennas can work together with tunable impedance matching circuits at low ground clearances such as for MIMO applications that retain high efficiencies. These antennas can have high radiation efficiency so that the tunable impedance matching circuits can realize high antenna efficiency over wide frequency bands. In one embodiment utilizing voltage variable tuning, these antennas can cover a wide frequency range such as of 700 to 960 (LB), 1700 to 2200 MHz (MB) and 2300-2700 MHz (HB). In one embodiment, both antennas have a LB dominated flag, and a MB-HB dominated flag. In another embodiment, the location of the two antennas can be selected to achieve low correlation coefficient necessary for increased or optimum MIMO operation.

The exemplary embodiments improve antenna efficiency and radiation efficiency. Antenna efficiency is essentially the ratio (e.g., in % or dB) of total power radiating out of the antenna divided by total power injected into the antenna. Radiation efficiency is the ratio of "calculated total power radiated out of the antenna if no power was lost due to mismatch", divided by total power injected into the antenna. The latter, radiation efficiency, can be a better measure of the antenna's ability to radiate, and a better measure of how much power is lost as dissipative energy, either in the ohmc losses in the antenna/phone device, or if in use case, into the user.

Other configurations or elements can be used in place of or in addition to one or more elements or configurations of the exemplary embodiments, including configurations and/or elements described in U.S. Provisional Application No. 62/061,750 entitled "Wide Band Antenna Systems" which was filed on Oct. 9, 2014, as well as described in U.S. patent application Ser. No. 14/877,979 entitled "Wide Band Antenna Systems" which was filed contemporaneously herewith, the disclosures of which are incorporated herein by reference in their entirety.

In one or more embodiments, the primary and diversity antennas can include parallel coupled monopoles for LB and for MB and HB communications. In another embodiment, the antennas can be set on or in proximity to the bottom (or the top) of the wireless devices (e.g., a mobile phone). In one or more embodiments, single feed antennas can be utilized. In one or more embodiments, high antenna efficiency and high radiation efficiency for tunable matching applications can be provided. In one or more embodiments, a small dimension in the y direction can be utilized, which is suitable for a small ground clearance device which enables larger screens and/or larger batteries without making the device overall dimensions larger.

In one or more embodiments, low ground clearance can be utilized. In one or more embodiments, good antenna performance can be provided, such as in Beside Head and Hand Right (BHHR) for primary and in Beside Head and Hand Left (BHHL) for diversity. In one or more embodiments, low antenna pattern correlation coefficients can be provided.

One or more of the exemplary embodiments can be utilized in multi-antenna and/or multi-port antenna systems used to address Carrier Aggregation (CA) requirements for handsets, such as LB antennas that must cover 700-960 MHz under all use-cases.

Other embodiments are described by the subject disclosure.

One embodiment of the subject disclosure includes a mobile communication device including a transceiver, an antenna system, a matching network and a controller. The antenna system is coupled with the transceiver, where the antenna system includes a first pair of flag antennas and a second pair of flag antennas, where one of the first or second pairs of flag antennas are primary antennas and the other of the first or second pairs of flag antennas are diversity antennas, where the first pair of flag antennas have a first single feed point and are connected via a first transmission line, and where the second pair of flag antennas have a second single feed point and are connected via a second transmission line. The matching network is coupled with the transceiver and the antenna system, where the matching network comprises a tunable reactive element. The controller is coupled with the matching network, where the controller adjusts the tunable reactive element to provide impedance tuning.

One embodiment of the subject disclosure includes an antenna system having first and second pairs of flag antennas and an RF switch. The first pair of flag antennas has a first single feed point and is connected with a transceiver of a mobile communication device. The second pair of flag antennas has a second single feed point and is connected with the transceiver of the mobile communication device. An RF switch connected with the first and second pairs of flag antennas, where the RF switch has a first position in which the first pair of flag antennas are primary antennas and the second pair of flag antennas are diversity antennas. The RF switch has a second position in which the second pair of flag antennas are the primary antennas and the first pair of flag antennas are the diversity antennas.

One embodiment of the subject disclosure includes a communication device having a transceiver, an antenna system, a matching network and a controller. The antenna system is coupled with the transceiver, where the antenna system includes a first pair of antennas and a second pair of antennas. One of the first or second pairs of antennas are primary antennas and the other of the first or second pairs of antennas are diversity antennas. The first pair of antennas has a first single feed point and are connected via a first transmission line. The second pair of antennas has a second single feed point and are connected via a second transmission line. The matching network is coupled with the transceiver and the antenna system, where the matching network comprises a tunable reactive element. The controller is coupled with the matching network, where the controller adjusts the tunable reactive element to provide impedance tuning.

FIG. 1A depicts an illustrative embodiment of a communication device 100. The communication device 100 can comprise one or more transceivers 102 coupled to an antenna system 101, which can be any number of antennas.

As an example, each transceiver can have transmitter and receiver sections herein described as transceiver 102 or transceivers 102. The communication device 100 can have one or more tunable circuits 122 including reactive element(s) 190, one or more tuning sensors 124, a user interface (UI) 104, a power supply 114, a location receiver 116, a motion sensor 118, an orientation sensor 120, and/or a controller 106 for managing operations thereof. The transceiver 102 can support short-range and/or long-range wireless access technologies, including Bluetooth, ZigBee, Wireless Fidelity (WiFi), Digital Enhance Cordless Telecommunications (DECT), or cellular communication technologies, just to mention a few. The communication device 100 can be a multimode device capable of providing communication services via various wireless access technologies, including two or more such services simultaneously.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 102 can also be adapted to support circuit-switched wireline access technologies such as Public Switched Telephone Network (PSTN), packet-switched wireline access technologies such as TCP/IP, Voice over IP-VoIP, etc., or combinations thereof.

Figure 1B:
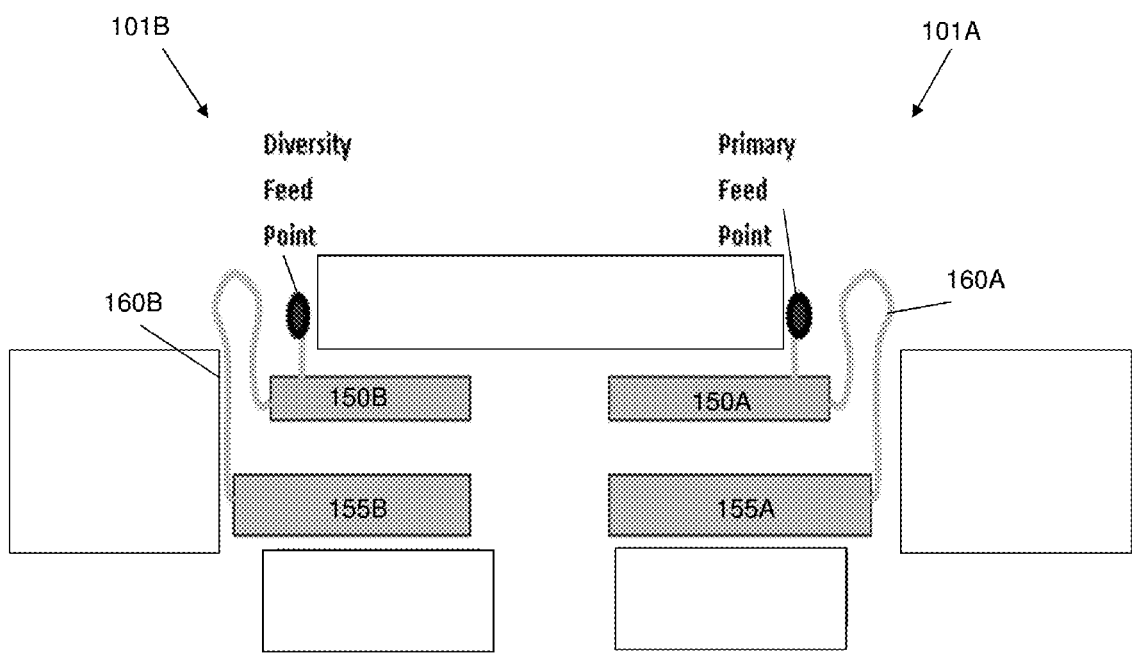

Referring additionally to FIG. 1B, the schematic structure is illustrated of primary and diversity antennas 101A and 101B of antenna system 101. Each antenna 101A and 101B can include two flags (e.g., an MB/HB flag 150 and a LB flag 155) that are attached to a single feed. A high impedance transmission line 160 can extend the frequency of operation lower for the antenna. The low band flag 155 can have a controlled coupling to the mid and high band flag 150 that extends the frequency of operation higher for the antenna system 101. In one or more embodiments, the symmetry (including being substantially symmetrical such as having similar shapes with dimensions that are within 10% of each other) of the primary and diversity antennas of antenna system 101 can control the correlation coefficient so that their antenna patterns spatially complement each other.

Figure 1C:
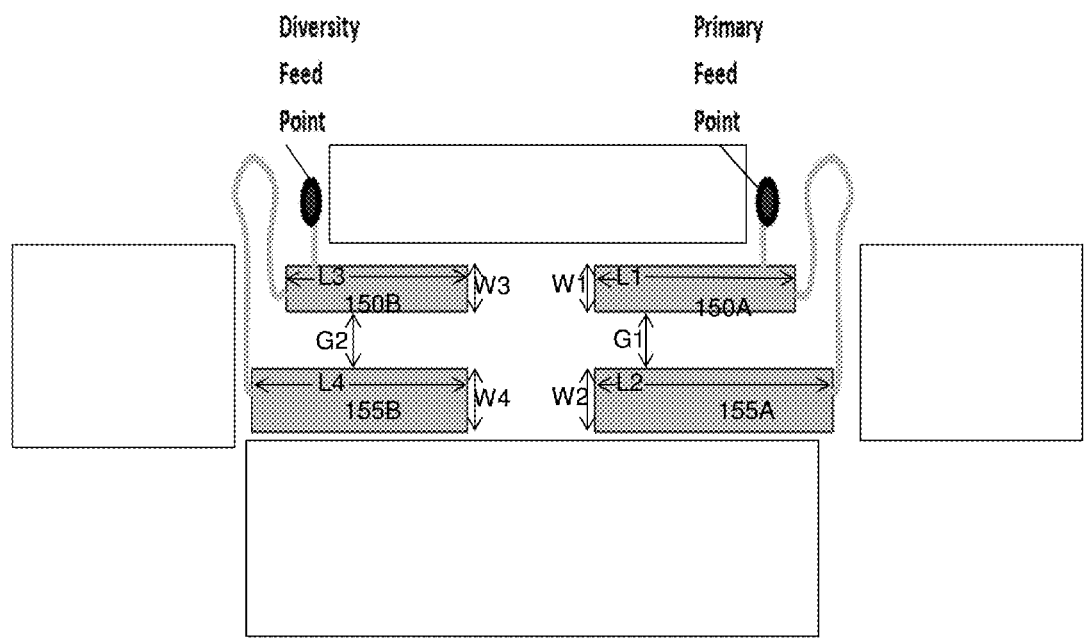
Figure 1D:
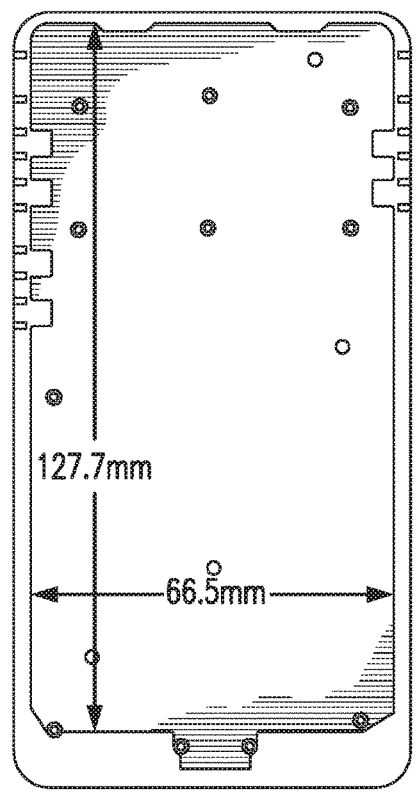
Figure 1D:
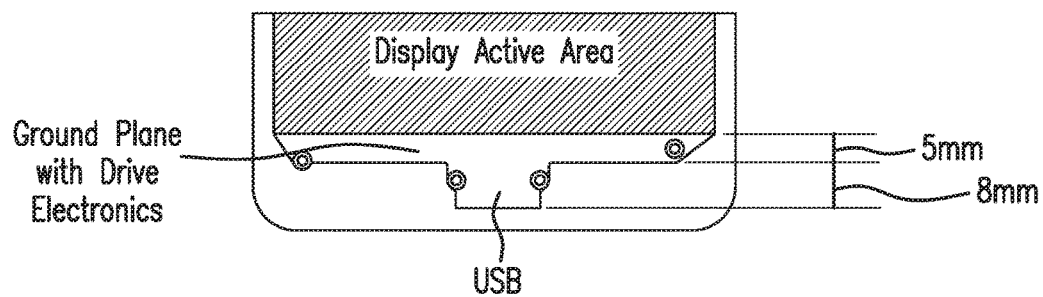

In one or more embodiments, dimensions, shapes and/or positions for the group of antennas of antenna system 101 can achieve a desired performance characteristic while fitting different mechanical arrangements. These dimensions, shapes and/or positions can be adjusted to achieve other desired performance characteristic and/or for fitting other mechanical arrangements. In FIGS. 1C-1D, L1=Length of Mid & High Band flag on Primary Antenna; L2=Length of Low Band flag on Primary Antenna; W1=Width of Mid & High Band flag on Primary Antenna; W2=Width of Low Band flag on Primary Antenna; L3=Length of Mid & High Band flag on Diversity Antenna; L4=Length of Low Band flag on Diversity Antenna; W3=Width of Mid & High Band flag on Diversity Antenna; W4=Width of Low Band flag on Diversity Antenna; G1=Width of Gap between two flags on Primary Antenna; G2=Width of Gap between two flags on Diversity Antenna; T1=Length of transmission line on Primary Antenna; and T2=Length of transmission line on Diversity Antenna. As an example shown in FIGS. 1C-1D, the following values can be utilized for a plastic chassis containing a 66.5 mm×127.7 mm ground plane with 8 mm ground clearance: L1=26.4 mm (Feed can be 17 mm down the flag length); L2=30.8 mm (Flag can curve around corner); W1=3.2 mm; W2=5 mm; L3=24.5 mm (Feed can be 18 mm down the flag length); L4=30 mm (Flag can curve around corner); W3=2.5 mm; W4=5 mm; G1=1.5 mm; G2=1.5 mm; T1=21 mm (0.8 mm wide); T2=24 mm (0.8 mm wide); distance between Primary and Diversity antenna=14.8 mm. In one or more embodiments, these lengths can be adjusted approximately +/−10%. In one or more embodiments, these gaps can be adjusted approximately +/−1 mm. In one or more embodiments, the flag widths can be adjusted approximately +/−1 mm.

Figure 1E:
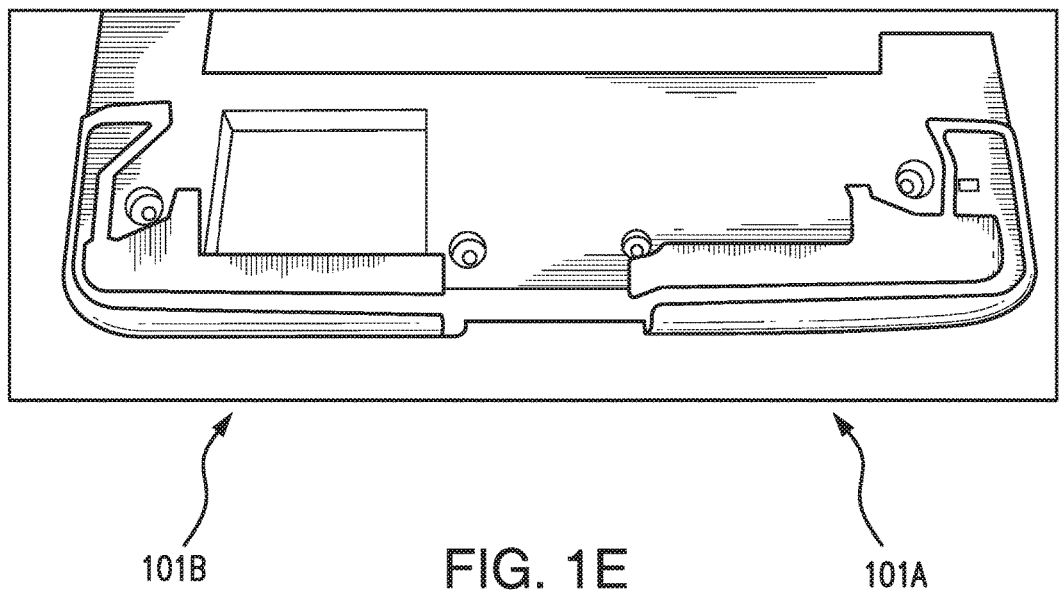
Figure 1F:
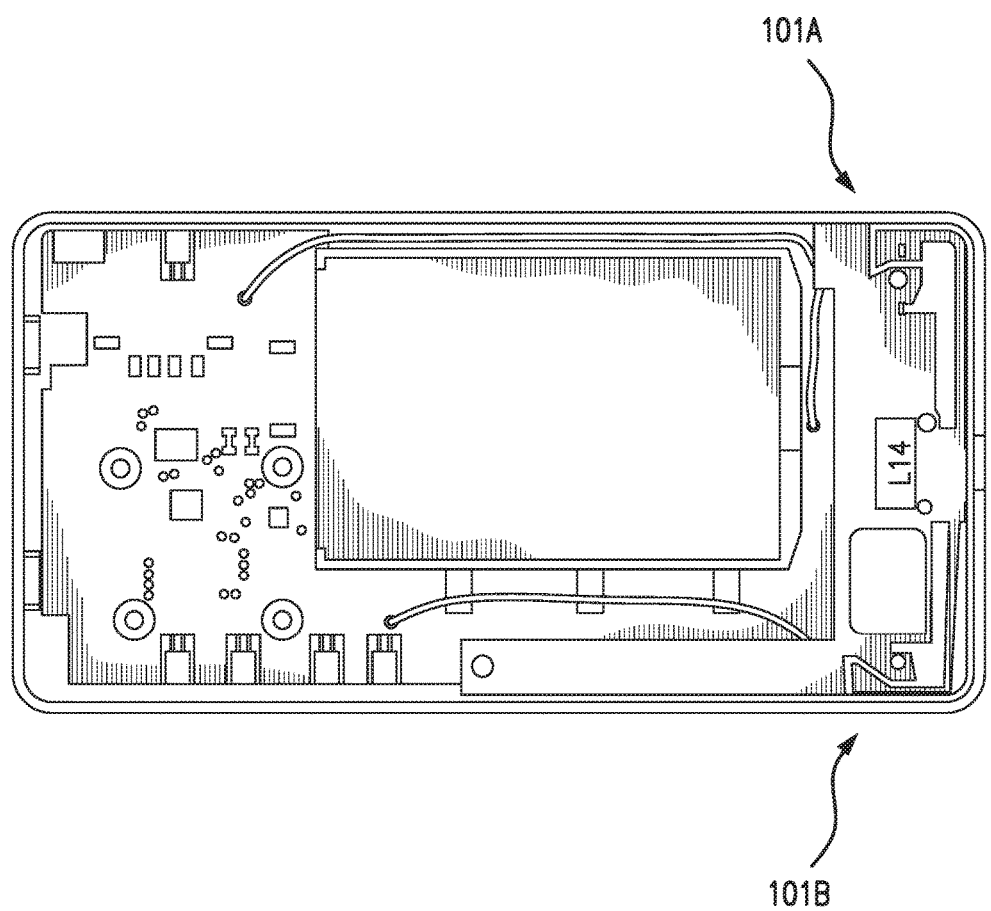

Referring additionally to FIGS. 1E-1F, the first and second pairs of flag antennas 101A and 101B are shown where each of the high band flags are wrapped around the edge of the antenna carrier. The first and second pairs of flag antennas 101A and 101B can be positioned in the bottom of the communication device 100.

Figure 1G:
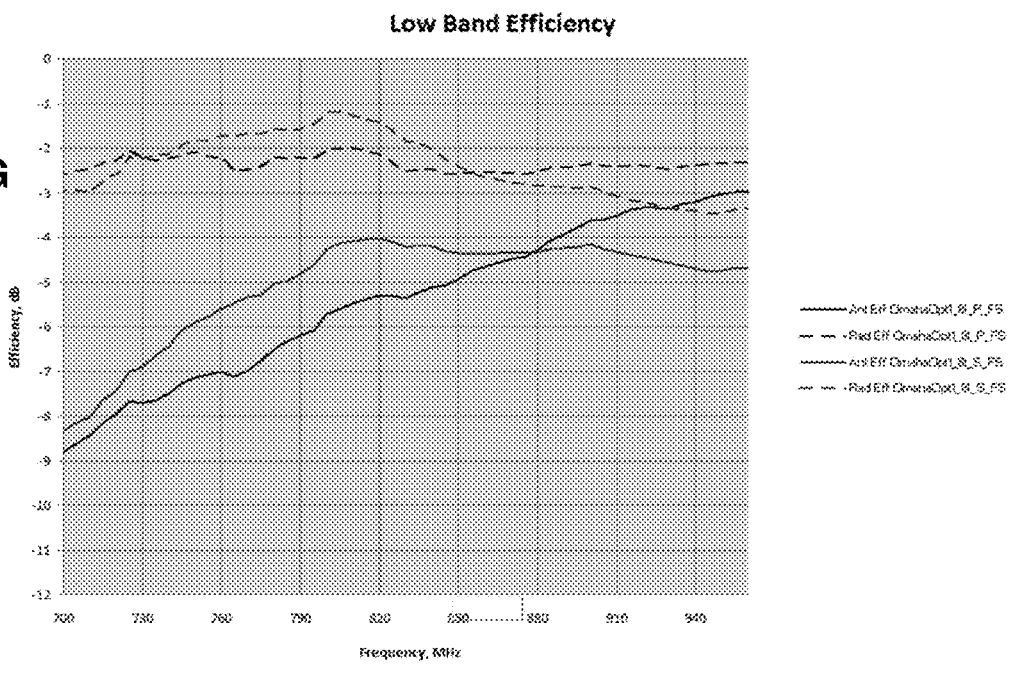
FIGS. 1G-1P depict graphical representations of the efficiency and correlation coefficients for the antennas of FIGS. 1A-F.

Referring to FIG. 1G, a graphical representation is presented for the measured free space low bands antenna (solid) and radiation (dashed) efficiency of the primary (black) and diversity (red) antennas at 8 mm ground clearance.

Figure 1H:
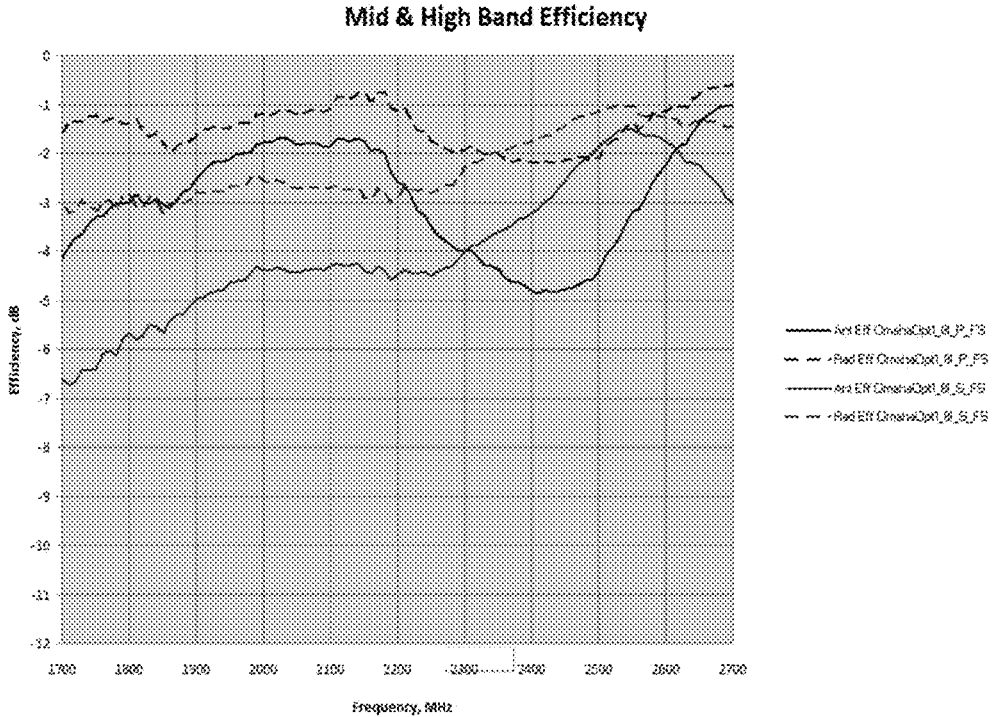

Referring to FIG. 1H, a graphical representation is presented for the measured free space mid and high bands antenna (solid) and radiation (dashed) efficiency of the primary (black) and diversity (red) antennas at 8 mm ground clearance.

Figure 1I:
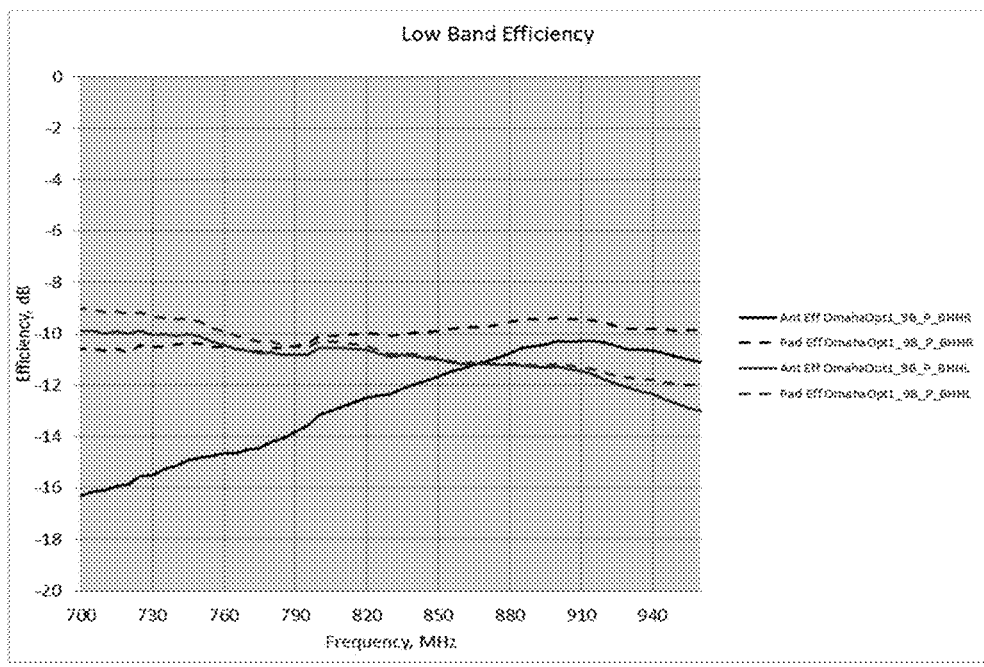

Referring to FIG. 1I, a graphical representation is presented for the measured LB primary antenna efficiency (solid) and radiation efficiency (dashed) tested in the BHHR (black) and BHHL (red) conditions.

Figure 1J:
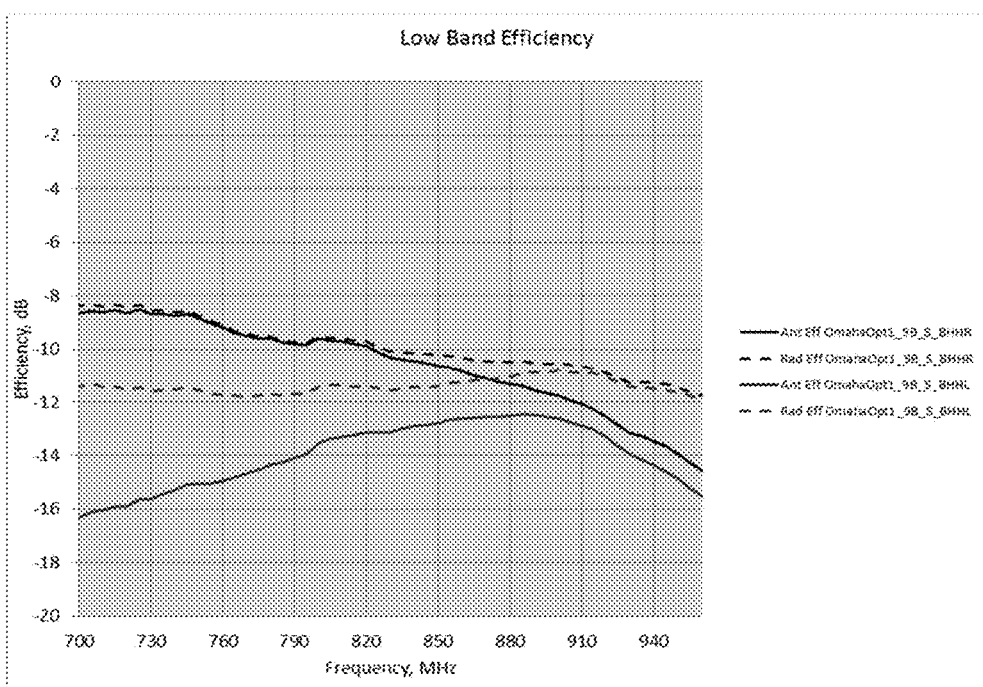

Referring to FIG. 1J, a graphical representation is presented for the measured LB diversity antenna efficiency (solid) and radiation efficiency (dashed) tested in the BHHR (black) and BHHL (red) conditions.

Figure 1K:
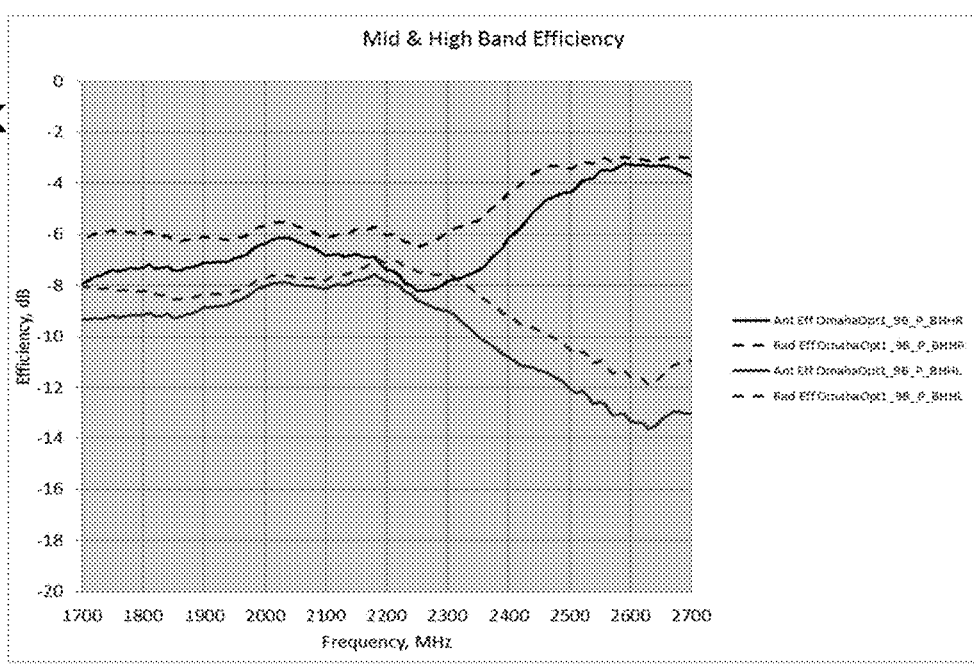

Referring to FIG. 1K, a graphical representation is presented for the measured MB and HB primary antenna efficiency (solid) and radiation efficiency (dashed) tested in the BHHR (black) and BHHL (red) conditions.

Figure 1L:
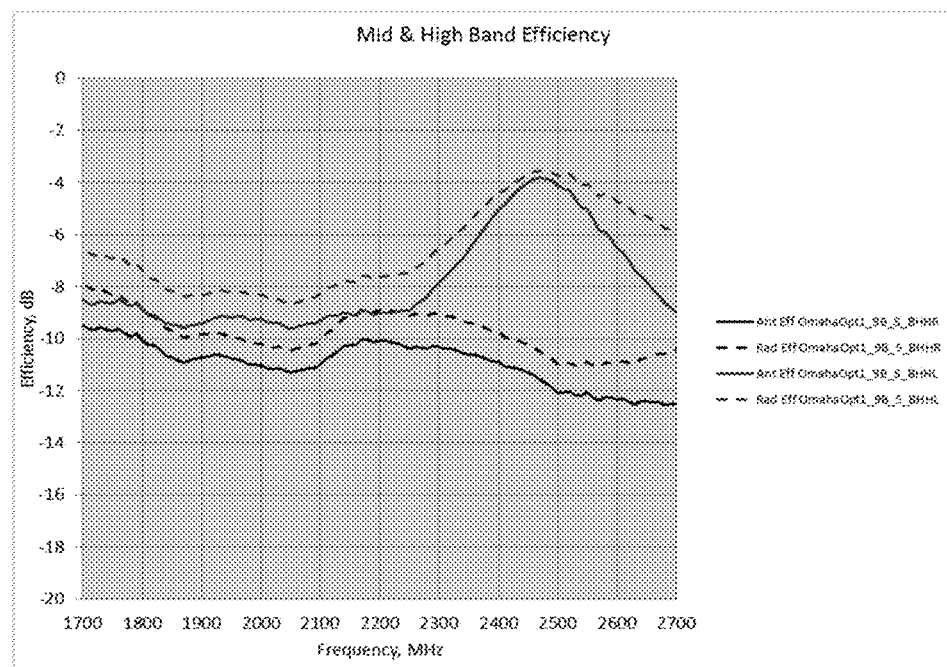

Referring to FIG. 1L, a graphical representation is presented for the measured MB and HB diversity antenna efficiency (solid) and radiation efficiency (dashed) tested in the BHHR (black) and BHHL (red) conditions.

Figure 1M:
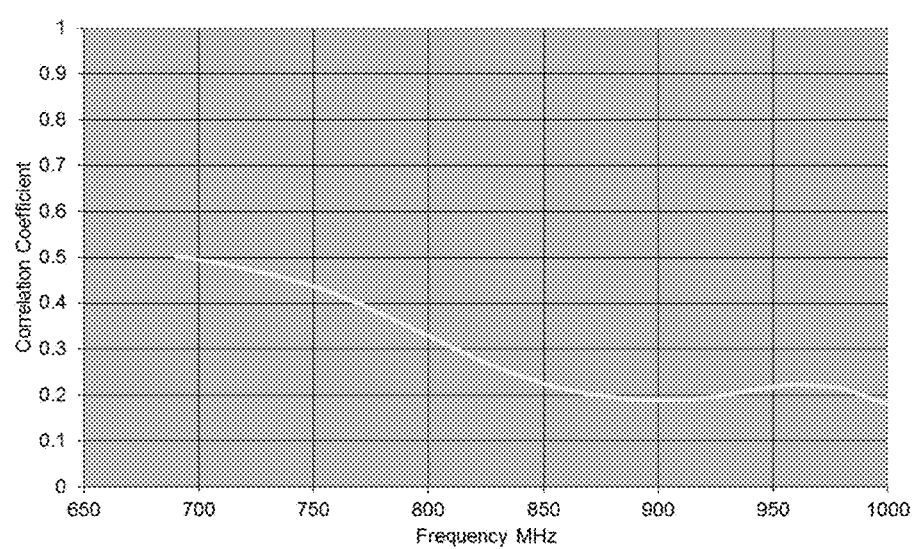

Referring to FIG. 1M, a graphical representation is presented for the measured LB antenna pattern correlation coefficients.

Figure 1N:
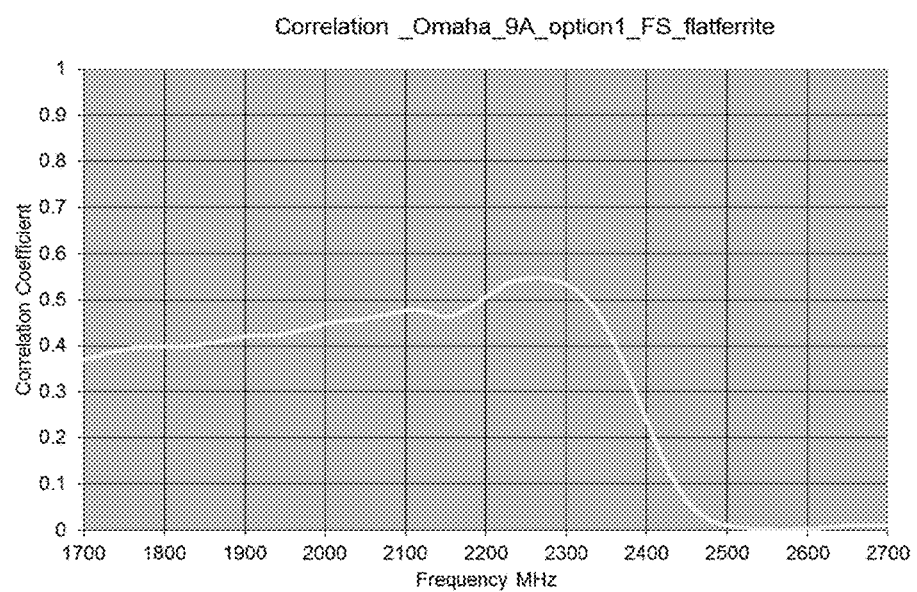

Referring to FIG. 1N, a graphical representation is presented for the measured MB & HB antenna pattern correlation coefficients.

Figure 1O:
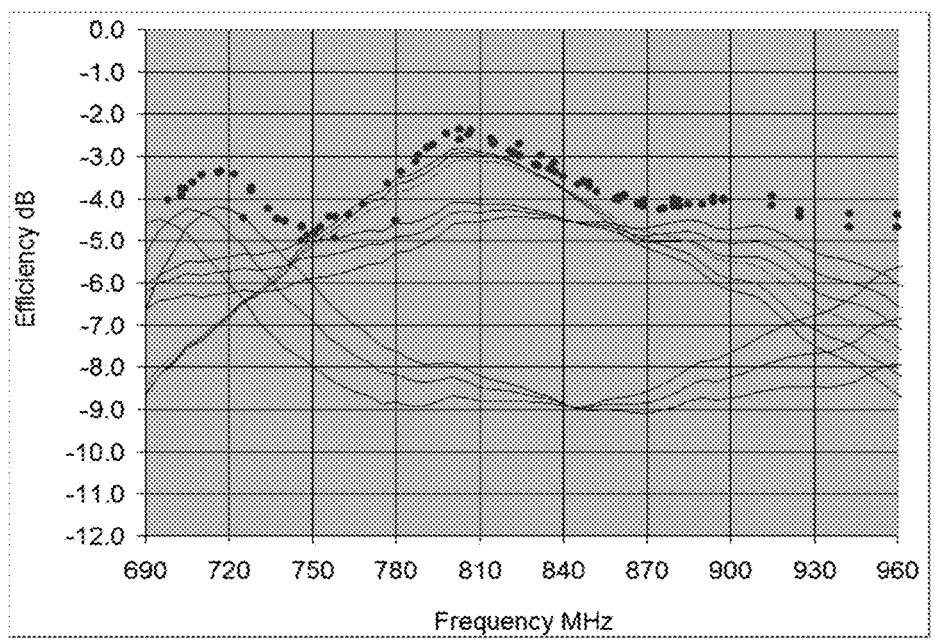

Referring to FIG. 1O, a graphical representation is presented for the expected peak (red) and measured (blue) low band antenna efficiency using high radiation efficiency antennas and with a tunable impedance matching network at a selected sample of tuner voltages.

Figure 1P:
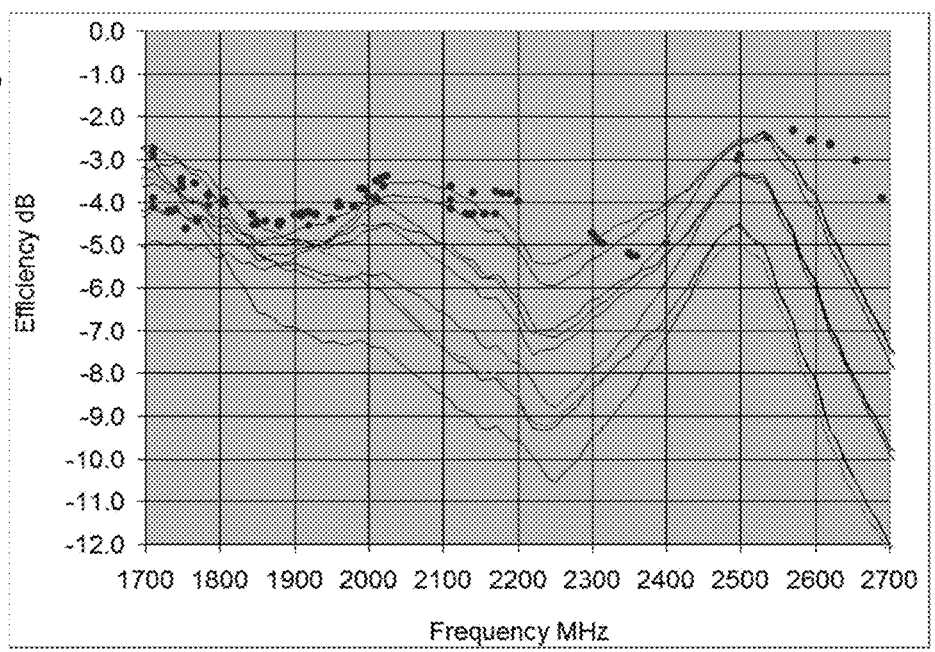

Referring to FIG. 1P, a graphical representation is presented for the expected peak (red) and measured (blue) mid and high antenna efficiency using high radiation efficiency antennas and a tunable impedance matching network at a selected sample of tuner voltages.

Figure 1Q:
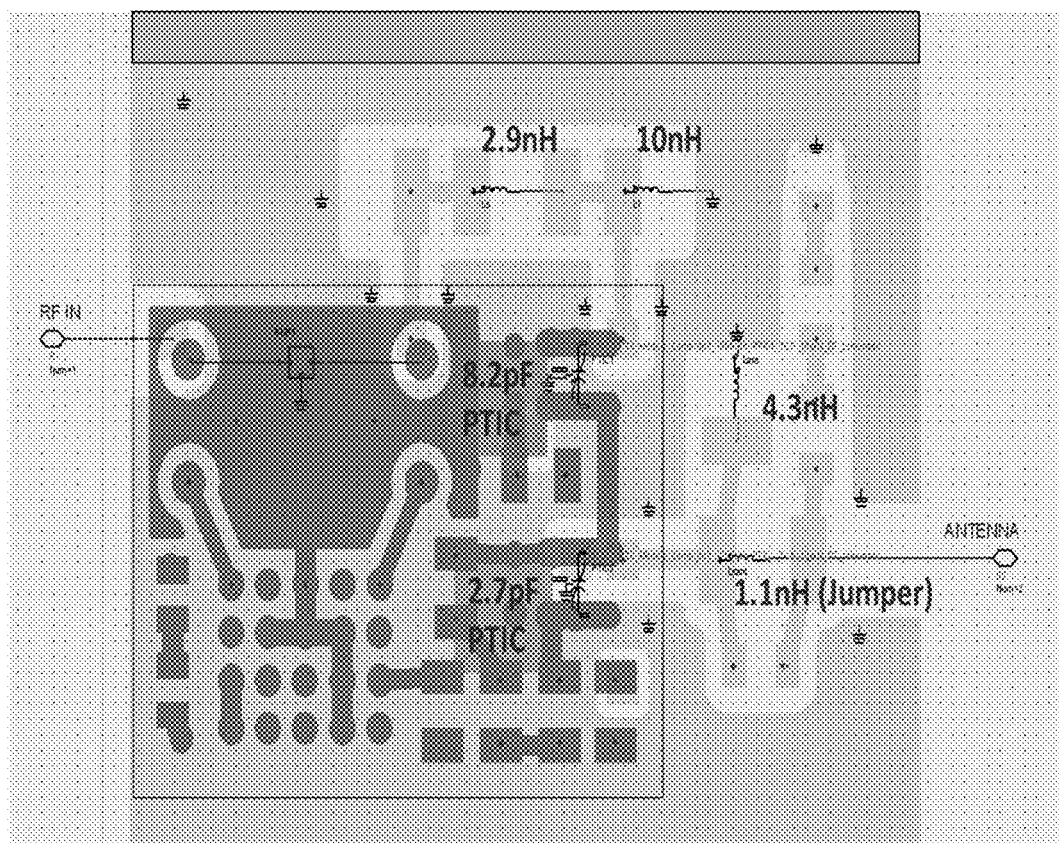
FIG. 1Q depicts an illustrative embodiment of another communication device that provides high radiation efficiency antennas in conjunction with impedance tuning.

Referring to FIG. 1Q, an exemplary antenna voltage variable impedance matching tuner circuit schematic is superimposed on a board layout.

Figure 1R:
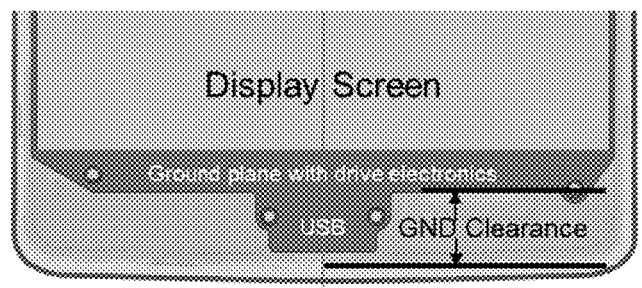
FIG. 1R depicts an illustrative embodiment of ground clearance for another communication device that provides high radiation efficiency antennas in conjunction with impedance tuning.
Figure 1S:
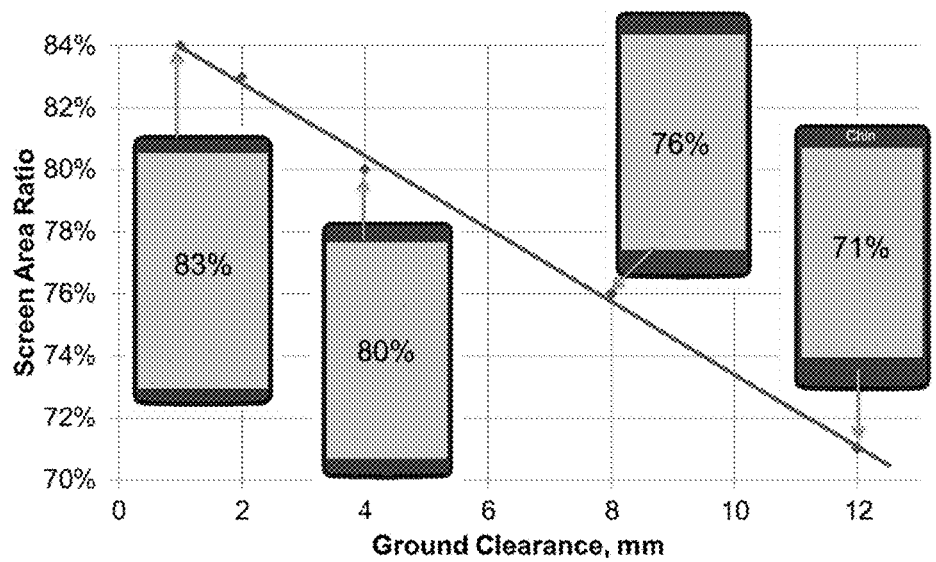
FIG. 1S depicts a graphical representation of ground clearance and screen area ratio for communication devices.

Referring to FIG. 1R, an illustrative embodiment of ground clearance is illustrated for another communication device that provides high radiation efficiency antennas in conjunction with impedance tuning;

Referring to FIG. 1S, a graphical representation is illustrated for ground clearance and screen area ratio for communication devices;

In one embodiment, the communication device 100 can include an RF switch 150 (or other component) for switching the functionality of antennas of the antenna system 101 including switching primary antennas to diversity antennas and vice versa. For example, parameters of the communication device 100 can be monitored, detected or otherwise determined in order to identify a change in impedance. The impedance change can result from a change in use case (e.g., switching from left hand to right hand to hold phone). The identification of the impedance change can trigger a change in the antenna system configuration via the RF switch 150 (e.g., controlled by controller 106) such that the first pair of flag antennas 101A that were previously operating as the primary antennas now operate as the diversity antennas and the second pair of flag antennas 101B that were previously operating as the diversity antennas now operate as the primary antennas. The number of times this switch occurs can be based on the detected parameters, such as according to a user that keeps switching hands during a communication session.

The tunable circuit 122 can comprise one or more variable reactive elements such as variable capacitors, variable inductors, or combinations thereof that are tunable with digital and/or analog bias signals. The tunable circuit 122 can represent a tunable matching network coupled to the antenna system 101 to compensate for a change in impedance of the antenna 101, a compensation circuit to compensate for mutual coupling in a multi-antenna system, an amplifier tuning circuit to control operations of an amplifier of the transceiver 102, a filter tuning circuit to alter a pass band of a filter used by the transceiver 102, and so on. In one or more embodiments, the tunable circuit 122 is connected with all of the flag antennas of antenna system 101 to enable tuning of all of the antennas.

Figure 2:
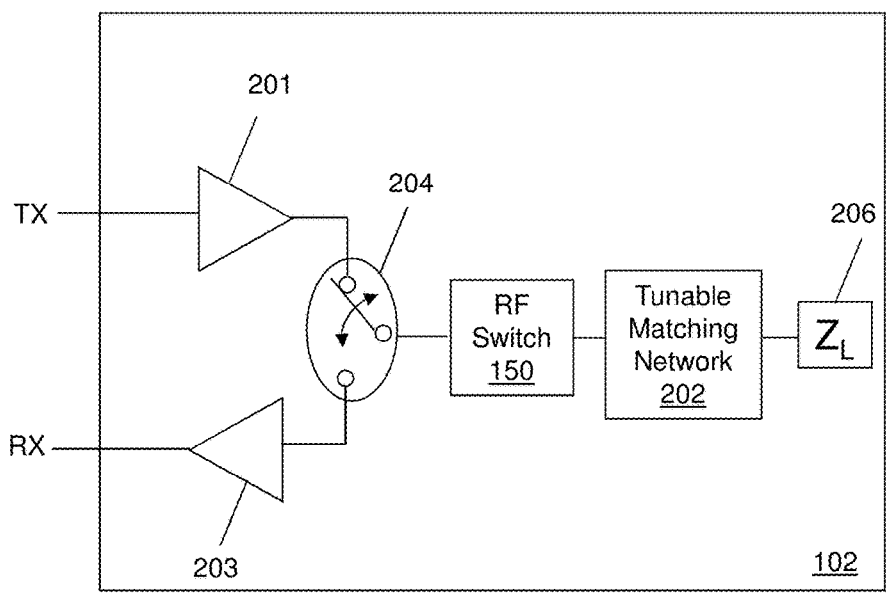
FIG. 2 depicts an illustrative embodiment of a portion of a transceiver of the communication device of FIGS. 1A-1F.

In one or more embodiments, tuning sensors 124 can be placed at any stage of the transceiver 102 such as, for example, before or after a matching network 202, and/or at a power amplifier 201 as shown in FIG. 2. The tuning sensors 124 can utilize any suitable sensing technology such as directional couplers, voltage dividers, or other sensing technologies to measure signals at any stage of the transceiver 102. The digital samples of the measured signals can be provided to the controller 106 by way of analog-to-digital converters included in the tuning sensors 124. Data provided to the controller 106 by the tuning sensors 124 can be used to measure, for example, transmit power, transmitter efficiency, receiver sensitivity, power consumption of the communication device 100, frequency band selectivity by adjusting filter passbands, linearity and efficiency of power amplifiers, specific absorption rate (SAR) requirements, and so on. The controller 106 can be configured to execute one or more tuning algorithms to determine desired tuning states of the tunable circuit 122 based on the foregoing measurements. The controller 106 can also switch the primary and diversity antennas via RF switch 150 based on data obtained from the tuning sensors 124.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger. The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceiver 102 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 106 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 can be used by the subject disclosure. The communication device 100 can include a slot for inserting or removing an identity module such as a Subscriber Identity Module (SIM) card. SIM cards can be used for identifying and registering for subscriber services, executing computer programs, storing subscriber data, and so forth.

One or more of the exemplary embodiments take into account that mobile device antennas can perform more efficiently when placed in areas away from chassis metal. One or more of the exemplary embodiments can include a large screen. One or more of the exemplary embodiments can utilize thinner form factors that proportionately utilize more of chassis metal for mechanical strength. One or more of the exemplary embodiments can provide low antenna pattern correlation coefficients between the primary and diversity antennas so that the antenna pair has more robust MIMO coverage. One or more of the exemplary embodiments can provide antenna performance that meets all carrier specifications, not only in free space, but also in wide ranging use cases, especially in use cases of the left hand head (BHHL) and the right hand head (BHHR). One or more of the exemplary embodiments can provide for a grounded connector, such as a micro USB connector, for charging and wired data transfer, placed at the bottom center edge of the phone. One or more of the exemplary embodiments can enable one or more speakers to be positioned on or in proximity to the bottom of the phone.

FIG. 2 depicts an illustrative embodiment of a portion of the wireless transceiver 102 of the communication device 100 of FIG. 1. In GSM applications, the transmit and receive portions of the transceiver 102 can include amplifiers 201, 203 coupled to a tunable matching network 202 that is in turn coupled to an impedance load 206. In one or more embodiments, a full duplex configuration without switch 204 can be utilized such as for an LTE or WCDMA application. The tunable matching network 202 can include all or a portion of the tuning circuit 122 of FIG. 1, such as variable capacitors to enable high linearity tuning while satisfying performance criteria such as insertion loss thresholds and/or response time speed. The impedance load 206 in the present illustration can be all or a portion of the antenna system (e.g., reconfigurable via RF switch 150) as shown in FIG. 1A (herein antenna 206). In one or more embodiments, the RF switch 150 can be on the Tx/Rx side of the matching network(s) 202. In another embodiment, a separate matching network 202 can be used for each antenna. A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA, UMTS, LTE, and so forth. The exemplary embodiments are applicable to all types of radio technologies including WiFi, GPS and so forth, and are not intended to be limited to cellular access technologies. These undisclosed configurations are applicable to the subject disclosure.

Figure 3:
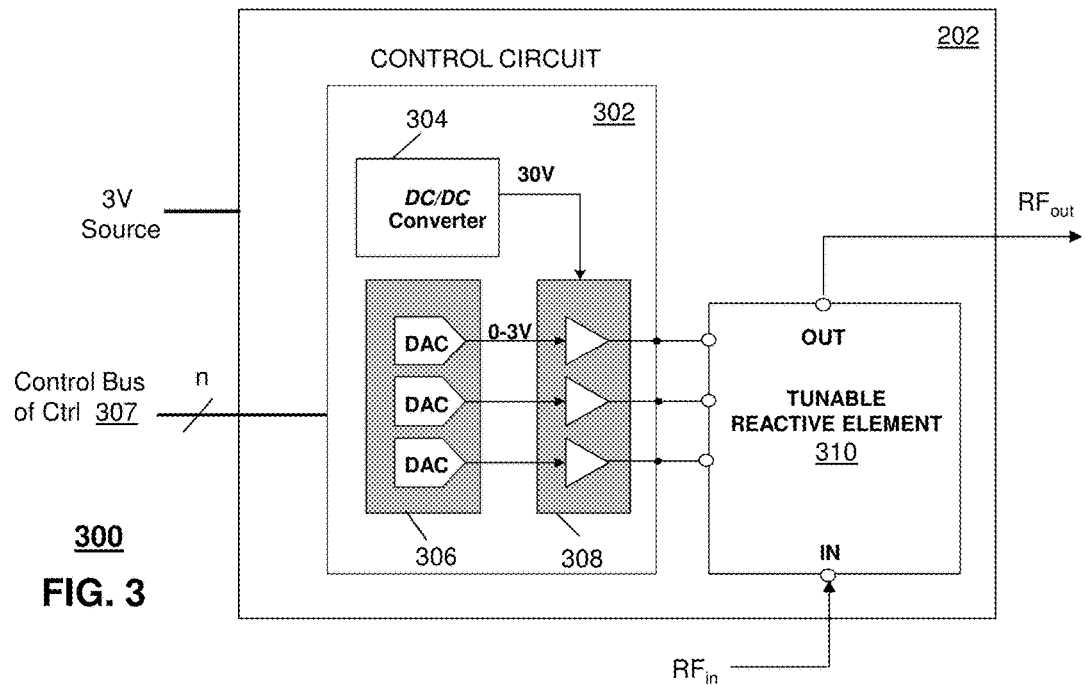
FIGS. 3-6 depict illustrative embodiments of a tunable matching network of the transceiver of FIG. 2.
Figure 4:
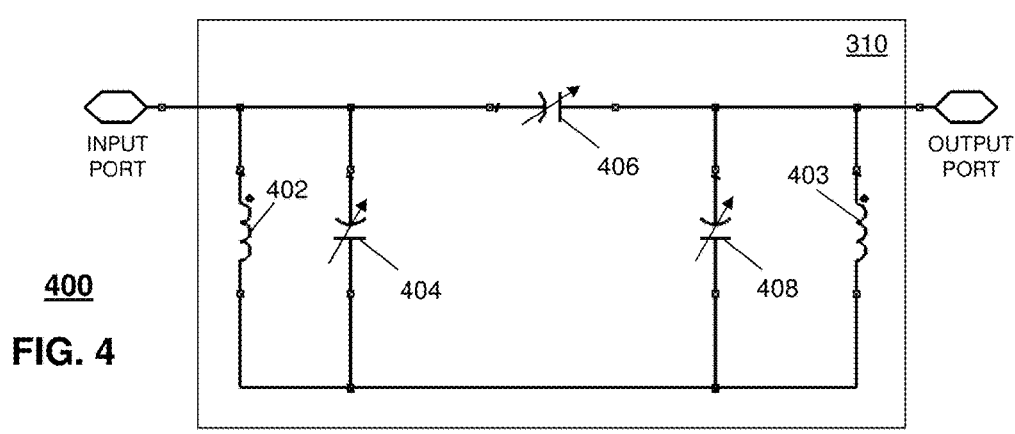

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 404-408 and two inductors 402-403 with a fixed inductance. Circuit configurations such as "Tee", "Pi", and "L" configurations for a matching circuit are also suitable configurations that can be used in the subject disclosure.

The tunable capacitors 404-408 can each utilize technology that enables tunability of the reactance of the component. One embodiment of the tunable capacitors 404-408 can utilize voltage or current tunable dielectric materials. The tunable dielectric materials can utilize, among other things, a composition of barium strontium titanate (BST). In another embodiment, the tunable reactive element 310 can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 310 of FIG. 3.

The DC-to-DC converter 304 can receive a DC signal such as 3 volts from the power supply 114 of the communication device 100 in FIG. 1A. The DC-to-DC converter 304 can use technology to amplify a DC signal to a higher range (e.g., 30 volts) such as shown. The controller 106 can supply digital signals to each of the DACs 306 by way of a control bus 307 of "n" or more wires or traces to individually control the capacitance of tunable capacitors 404-408, thereby varying the collective reactive impedance of the tunable matching network 202. The control bus 307 can be implemented with a two-wire serial bus technology such as a Serial Peripheral Interface (SPI) bus (referred to herein as SPI bus 307). With an SPI bus 307, the controller 106 can transmit serialized digital signals to configure each DAC in FIG. 3. The control circuit 302 of FIG. 3 can utilize digital state machine logic to implement the SPI bus 307, which can direct digital signals supplied by the controller 106 to the DACs to control the analog output of each DAC, which is then amplified by buffers 308. In one embodiment, the control circuit 302 can be a stand-alone component coupled to the tunable reactive element 310. In another embodiment, the control circuit 302 can be integrated in whole or in part with another device such as the controller 106.

Although the tunable reactive element 310 is shown in a unidirectional fashion with an RF input and RF output, the RF signal direction is illustrative and can be interchanged. Additionally, either port of the tunable reactive element 310 can be connected to a feed point of the antenna 206, a structural element of the antenna 206 in an on-antenna configuration, or between antennas for compensating mutual coupling when diversity antennas are used, or when antennas of differing wireless access technologies are physically in close proximity to each other and thereby are susceptible to mutual coupling. The tunable reactive element 310 can also be connected to other circuit components of a transmitter or a receiver section such as filters, amplifiers, and so on, to control operations thereof.

Figure 6:
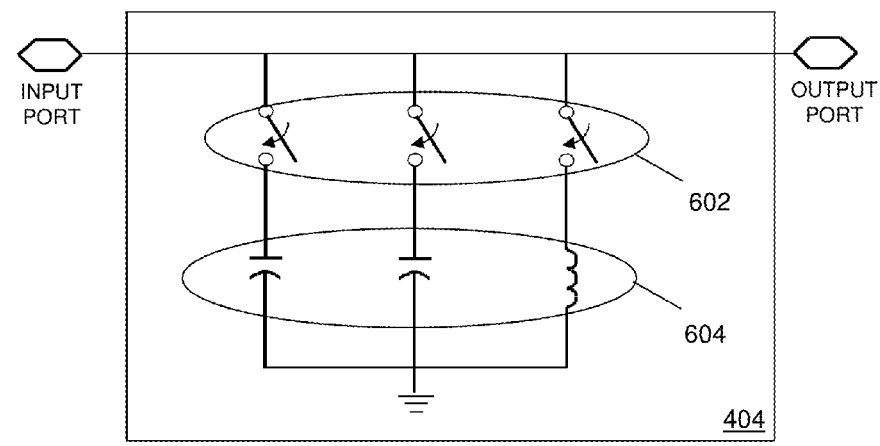

In another embodiment, the tunable matching network 202 of FIG. 2 can comprise a control circuit 502 in the form of a decoder and a tunable reactive element 504 comprising switchable reactive elements such as shown in FIG. 6. In this embodiment, the controller 106 can supply the control circuit 502 signals via the SPI bus 307, which can be decoded with Boolean or state machine logic to individually enable or disable the switching elements 602. The switching elements 602 can be implemented with semiconductor switches, MEMS, or other suitable switching technology. By independently enabling and disabling the reactive elements 604 (capacitor or inductor) of FIG. 6 with the switching elements 602, the collective reactive impedance of the tunable reactive element 504 can be varied by the controller 106.

Figure 5:
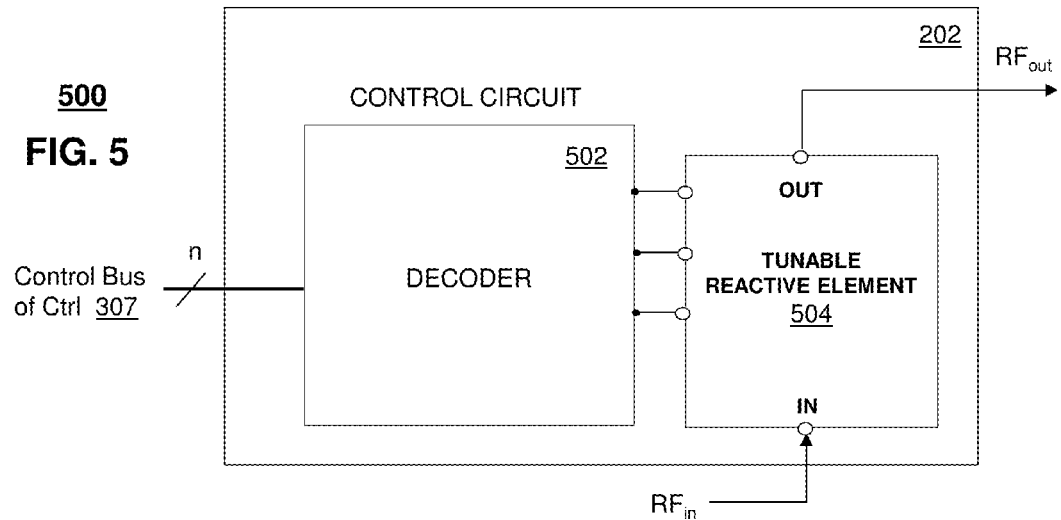

The tunable reactive elements 310 and 504 of FIGS. 3 and 5, respectively, can be used with various circuit components of the transceiver 102 to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, SAR requirements, among other operational parameters.

Figure 8:
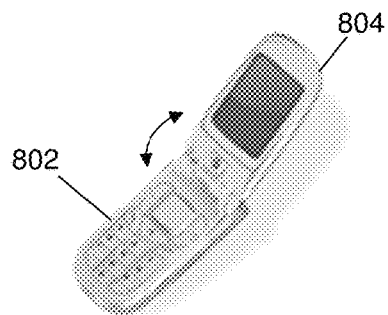
FIGS. 8-11 depict illustrative physical and operational use cases of a communication device.

FIG. 7 depicts an illustration of a look-up table stored in memory, which can be indexed by the controller 106 of the communication device 100 of FIG. 1A according to physical and/or functional use cases of the communication device 100. The desired tuning state can include values for the biasing signals and/or capacitance values to be employed for tuning of the variable capacitors, such as variable capacitors 425. A physical use case can represent a physical state of the communication device 100, while a functional use case can represent an operational state of the communication device 100. For example, for a flip phone 800 of FIG. 8, an open flip can represent one physical use case, while a closed flip can represent another physical use case. In a closed flip state (i.e., bottom and top flips 802-804 are aligned), a user is likely to have his/her hands surrounding the top flip 804 and the bottom flip 802 while holding the phone 800, which can result in one range of load impedances experienced by an internal or retrievable antenna (not shown) of the phone 800. The range of load impedances of the internal or retrievable antenna can be determined by empirical analysis.

With the flip open a user is likely to hold the bottom flip 802 with one hand while positioning the top flip 804 near the user's ear when an audio system of the phone 800, such audio system 112 of FIG. 1, is set to low volume, and voice channel is active. If, on the other hand, the audio system 112 is in speakerphone mode, it is likely that the user is positioning the top flip 804 away from the user's ear. In these arrangements, different ranges of load impedances can be experienced by the internal or retrievable antenna, which can be analyzed empirically. The low and high volume states of the audio system 112, as well as, a determination that a voice channel is active, illustrates varying functional use cases.

Figure 9:
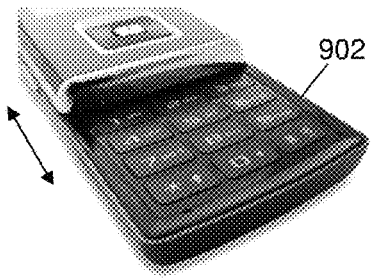
Figure 10:
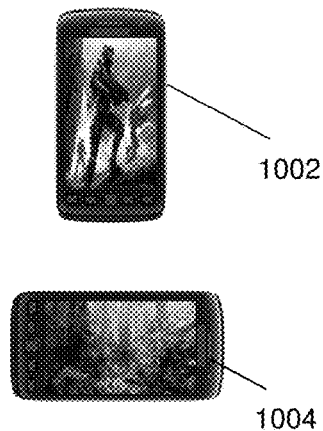
Figure 11:
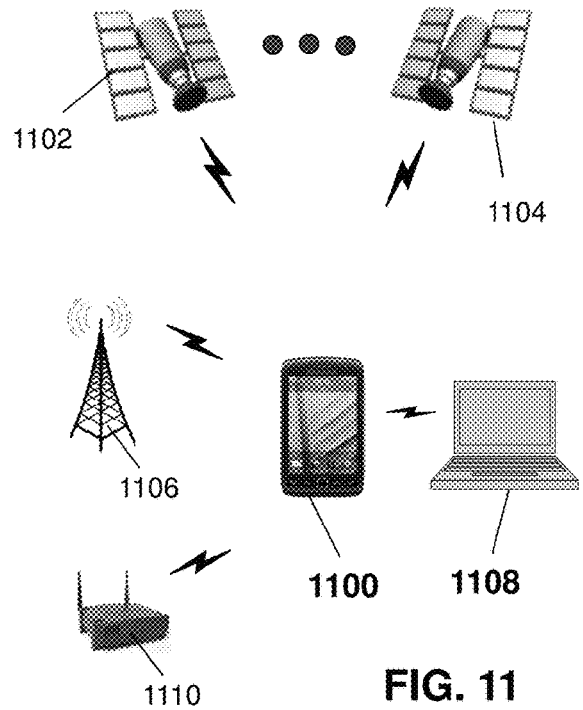

For a phone 900 with a slideable keypad 902 (illustrated in FIG. 9), the keypad in an outward position can present one range of load impedances of an internal antenna, while the keypad in a hidden position can present another range of load impedances, each of which can be analyzed empirically. For a smartphone 1000 (illustrated in FIG. 10) presenting a video game, an assumption can be made that the user is likely to hold the phone away from the user's ear in order to view the game. Placing the smartphone 1000 in a portrait position 1002 can represent one physical and operational use case, while utilizing the smartphone 1000 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1000 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 1100 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1100. For example, a multimode phone 1100 that provides GPS services by processing signals received from a constellation of satellites 1102, 1104 can be empirically analyzed when other access technologies are also in use. Suppose, for instance, that while navigation services are enabled, the multimode phone 1100 is facilitating voice communications by exchanging wireless messages with a cellular base station 1106. In this state, an internal antenna of the GPS receiver may be affected by a use case of a user holding the multimode phone 1100 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1100 (e.g., slider out), which can result in a probable hand position of the user of the multimode phone 1100. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1108 or with a wireless access point 1110. In diversity designs such as multiple-input and multiple output (MIMO) antennas, physical and functional use cases of a communication device can be measured empirically to determine how best to configure a tunable compensation circuit 122 such as shown in FIG. 1A.

The number of physical and functional use cases of a communication device 100 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined empirically. The empirical data collected and corresponding mitigation strategies can be recorded in the look-up table of FIG. 7 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

In one or more embodiments, information in table 7 can be used for impedance tuning in conjunction with re-configuring or switching the primary and diversity antennas.

Figure 12:
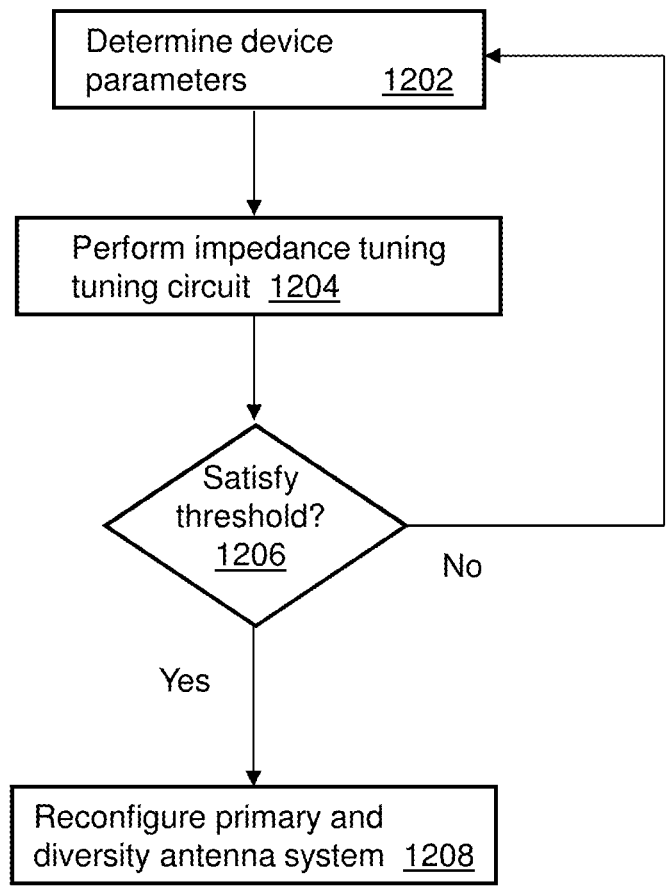
FIG. 12 depicts an exemplary method associated with the embodiments of FIGS. 1-11.

FIG. 12 depicts an illustrative method 1200 for providing a high linearity tuning device or component, such as tuning circuit 122. Method 1200 can begin with step 1202 in which one or more device parameters can be identified, measured or otherwise determined. The parameters can be various types that are utilized for determining or otherwise predicting an impedance mismatch including forward and reverse power metrics and so forth. At 1204, impedance tuning can be performed according to the device parameters. The impedance tuning can be based on closed-loop feedback or can be based on open-loop feedback. For instance, tuning can be performed by sampling parameters and then consulting a look-up table (e.g., table 700) that is indexed by the parameters. In another embodiment, the look-up table can be utilized for initial tuning (for example coarse tuning) and then subsequent tuning (for example fine tuning) can be performed based on an algorithm without utilizing the look-up table.

At 1206, if the tuning results in an impedance mismatch within a defined threshold for performance then method 1200 can return to 1202 and continue monitoring device parameters. If the threshold is not satisfied then at 1208 the RF switch 150 can be utilized to switch the primary and diversity antennas.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Radio band information can be generally available or otherwise retrievable in communication devices, which provides the broadest definition of where in a frequency spectrum a communication device such as a handset is operating (e.g., transmitting). In communication systems (e.g., cellular systems), frequencies can be commonly allocated for usage in a block or range of frequencies. This block or range of frequencies is commonly known as a radio band. Multiple radio bands can be present in any given cellular system, and in any geographic location there can be multiple cellular systems present.

A radio channel can identify a discrete set of frequencies in a cellular system that contains the downlink (from base station to the handset) and uplink (from handset to base station) radio signals. Downlink is also referred to as Rx and uplink is also referred to as Tx. In most systems, such as WCDMA (Wideband Code Division Multiple Access), uplink and downlink can use separate frequencies that are separated by the duplex distance, which is the number of Hz separating the uplink and downlink paths. For other systems, such as TD-LTE (Time Division Long Term Evolution), the uplink and downlink can use the same frequency.

One or more of the exemplary embodiments can utilize radio band information, including only radio band information in some embodiments or radio band information in combination with other information (e.g., measured operational parameters), for antenna tuning. The exemplary embodiments can apply to various types of devices, including wireless handsets operating utilizing one or more of various communication protocols.

RF tuning based on limited information, such as only the radio band, can create a number of problems. In an ideal cellular system that employs RF tuning, the tuner would be set to match every frequency on which the radio receives or transmits, with the understanding that typically a single antenna is used for both Rx and Tx which requires the RF tuner to change tuning state as the RF signal on the antenna changes frequency. For half-duplex systems, such as GSM that would be for every Rx and Tx, including neighbor cells. In full-duplex systems, such as WCDMA where both Rx and Tx are present concurrently, the RF tuner has to change when the frequency changes for handoffs and neighbor cell monitoring, and additionally the tuning state has to be a duplex setting for Rx and Tx on a frequency between the Rx and Tx frequencies.

In order to perform RF tuning in such an ideal system, the entity controlling the tuner could require exact knowledge in real time of all relevant information pertaining to operating the tuner, such as the radio timing, radio band, radio channel, RF duplex information, and transmit state. Tuning based on limited information occurs when the entity controlling the tuner does not have all the information required to set the RF tuner to match an exact frequency at a given time. For example, real time channel information could be missing, in which case the tuner control entity could set the RF tuner based on information pertaining to the Radio Band only.

Transmit (Tx) and Receive (Rx) operations often cannot or are not tuned in real-time. This can result in or necessitate a broader duplex type tuning. Duplex tuning refers to where the tunable element for a particular sub-band or radio channel is tuned to a frequency between uplink and downlink; one tuning state can be used for both Rx and Tx in this case. In some systems that are full-duplex (concurrent uplink and downlink, such as WCDMA), duplex tuning is commonly used. Other systems that are half-duplex (uplink and downlink are not concurrent, such as GSM), the tuner can be tuned for both Rx and Tx.

Sub-band describes a grouping of frequencies (e.g., radio channels) consisting of one or more radio channels. In tuning applications, sub-dividing a radio band into multiple sub-bands can provide the advantage of being able to apply a particular tuning state to a small or smaller range of radio channels. Sub-bands can be used in conjunction with storage and application of calibration data in cellular handsets, providing a compromise between accuracy and amount of storage needed to hold said calibration data.

An example of a radio band is the GSM 900 band, in which the uplink frequencies can occupy the range 880.0 to 915.0 MHz and the downlink frequencies can occupy the range 925.0 to 960.0 MHz. The duplex spacing can be 45 MHz. The first channel can be channel 975 which has uplink at 880.2 MHz and downlink at 915.2 MHz. The last channel can be channel 124 which has uplink at 914.8 MHz and downlink at 959.8 MHz.

The GSM 900 band can, for example, be subdivided into 3 sub bands as follows: Sub band 1 ranging from channel 975 to channel 1023 (48 channels, 9.6 MHz wide), Sub Band 2 ranging from channel 0 to channel 66 (66 channels, 13.2 MHz wide), and sub band 3 ranging from channel 67 to channel 124 (57 channels, 11.4 MHz wide). This is an example of a radio band and sub-bands, and the present disclosure can include various configurations of radio bands and sub-bands.

Similar principles can be applied to other existing wireless access technologies (e.g., UMTS, etc.) as well as future generation access technologies.

The exemplary embodiments describe use of pairs of flag antennas. However, one or more of the exemplary embodiments can utilize other types of antennas that are paired together where one of the pairs may or may not be a flag antenna.

The use of the term single feed point can include a configuration where there is no more than one feed point connected with a circuit.

Figure 13:
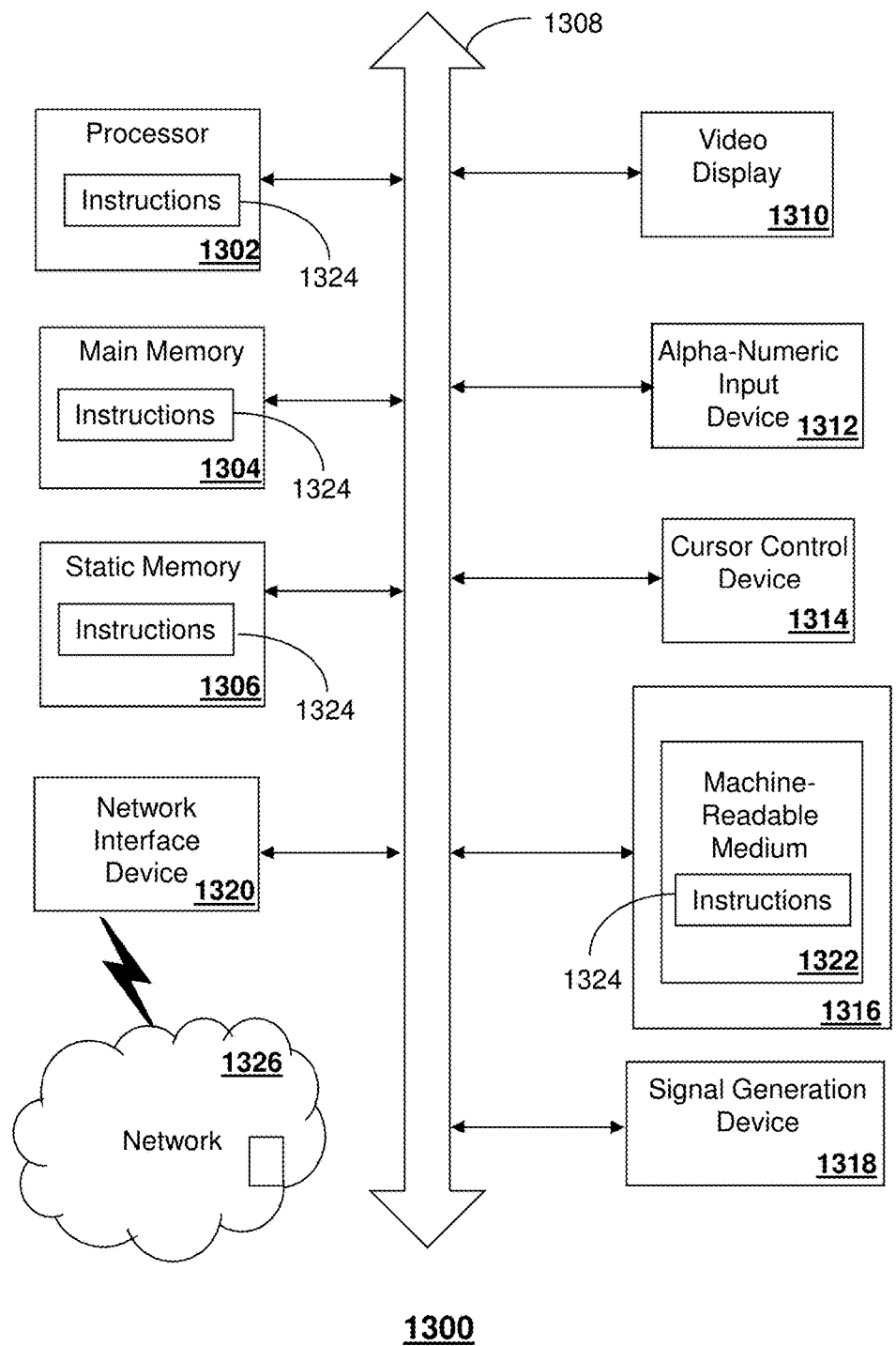
FIG. 13 depicts an illustrative diagrammatic representation of a machine in the form of a computer system within which a set of instructions, when executed, may cause the machine to perform any one or more of the methodologies disclosed herein.

FIG. 13 depicts an exemplary diagrammatic representation of a machine in the form of a computer system 1300 within which a set of instructions, when executed, may cause the machine to perform any one or more of the methods discussed above. One or more instances of the machine can operate, for example, as the communication device 100 of FIG. 1A, the controller 106, the control circuit 302, and/or the decoder 502, for enabling high linearity tuning via one or more of multiple bias points, anti-parallel diodes, choke inductor(s) and/or ground inductors. In some embodiments, the machine may be connected (e.g., using a network 1326) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1300 may include a processor (or controller) 1302 (e.g., a central processing unit (CPU), a graphics processing unit (GPU, or both), a main memory 1304 and a static memory 1306, which communicate with each other via a bus 1308. The computer system 1300 may further include a display unit 1310 (e.g., a liquid crystal display (LCD), a flat panel, or a solid state display. The computer system 1300 may include an input device 1312 (e.g., a keyboard), a cursor control device 1314 (e.g., a mouse), a disk drive unit 1316, a signal generation device 1318 (e.g., a speaker or remote control) and a network interface device 1320. In distributed environments, the embodiments described in the subject disclosure can be adapted to utilize multiple display units 1310 controlled by two or more computer systems 1300. In this configuration, presentations described by the subject disclosure may in part be shown in a first of the display units 1310, while the remaining portion is presented in a second of the display units 1310.

The disk drive unit 1316 may include a tangible computer-readable storage medium 1322 on which is stored one or more sets of instructions (e.g., software 1324) embodying any one or more of the methods or functions described herein, including those methods illustrated above. The instructions 1324 may also reside, completely or at least partially, within the main memory 1304, the static memory 1306, and/or within the processor 1302 during execution thereof by the computer system 1300. The main memory 1304 and the processor 1302 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 1322 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1300.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described). Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can include virtual processor(s). The processor can include a state machine, application specific integrated circuit, and/or programmable gate array including a Field PGA, or state machine. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A mobile communication device, comprising:
   a transceiver;
   an antenna system coupled with the transceiver, wherein the antenna system includes a first pair of flag antennas and a second pair of flag antennas, wherein one of the first or second pairs of flag antennas are primary antennas and another of the first or second pairs of flag antennas are diversity antennas, wherein the first pair of flag antennas have a first single feed point and are connected via a first transmission line, wherein the second pair of flag antennas have a second single feed point and are connected via a second transmission line, wherein a first flag of the first pair of flag antennas is utilized during middle and high band communications and a second flag of the first pair of flag antennas is utilized during low band communications, wherein a first high impedance transmission line connects between a first end of the first flag near the first single feed point and an end of the second flag, wherein a third flag of the second pair of flag antennas is utilized during middle and high band communications and a fourth flag of the second pair of flag antennas is utilized during low band communications, and wherein a second high impedance transmission line connects between a first end of the third flag near the second single feed point and an end of the fourth flag;
   a matching network coupled with the transceiver and the antenna system, wherein the matching network comprises a tunable reactive element; and
   a controller coupled with the matching network, wherein the controller:
      detects a use case configuration of the mobile communication device;
      obtains a device parameter;
      accesses biasing signals and capacitance values from a look-up table stored in memory according to the device parameter and the use case configuration; and
      adjusts the tunable reactive element according to the biasing signals and capacitance values in the look-up table to provide impedance tuning.

2. The mobile communication device of claim 1, further comprising an RF switch connected with the antenna system, wherein the RF switch has a first position in which the first pair of flag antennas are the primary antennas and the second pair of flag antennas are the diversity antennas, and wherein the RF switch has a second position in which the second pair of flag antennas are the primary antennas and the first pair of flag antennas are the diversity antennas.

3. The mobile communication device of claim 2, wherein the controller adjusts the RF switch between the first and second positions according to a determined impedance mismatch.

4. The mobile communication device of claim 1, further comprising a detector coupled with the matching network, wherein the detector measures forward and reverse power at a port of the matching network.

5. The mobile communication device of claim 4, wherein the tunable reactive element is adjusted based on the forward and reverse power.

6. The mobile communication device of claim 1, wherein the first and second pairs of flag antennas are substantially similar in size and shape, respectively.

7. The mobile communication device of claim 1, wherein the use case configuration is one of a physical use case configuration and a functional use case configuration, wherein the physical use case configuration is a physical state of the mobile communication device, and wherein the functional use case configuration is an operational state of the mobile communication device.

8. An antenna system, comprising:
   a first pair of flag antennas having a first high impedance transmission line connecting between the first pair of flag antennas at ends of each flag antenna in the first pair of flag antennas, and a first single feed point coupled with a transceiver of a mobile communication device;
   a second pair of flag antennas having a second high impedance transmission line connecting between the second pair of flag antennas at ends of each flag antenna in the second pair of flag antennas, and a second single feed point coupled with the transceiver of the mobile communication device;
   an RF switch connected between the transceiver of the mobile communication device and the first and second pairs of flag antennas, wherein the RF switch has a first position in which the first pair of flag antennas are primary antennas and the second pair of flag antennas are diversity antennas, and wherein the RF switch has a second position in which the second pair of flag antennas are the primary antennas and the first pair of flag antennas are the diversity antennas;
   a matching network coupled with the transceiver and the antenna system, wherein the matching network comprises a tunable reactive element; and
   a controller coupled with the matching network, wherein the controller:
      detects a use case configuration of the mobile communication device;
      obtains a device parameter;
      accesses biasing signals and capacitance values from a look-up table stored in memory according to the device parameter and the use case configuration; and
      adjusts the tunable reactive element according to the biasing signals and capacitance values in the look-up table to provide impedance tuning.

9. The antenna system of claim 8, wherein the RF switch is adjusted between the first and second positions according to a determined impedance mismatch.

10. The antenna system of claim 8, wherein the first single feed point is connected with a first flag of the first pair of flag antennas that is utilized during middle and high band communications, and wherein the second single feed point is connected with a third flag of the second pair of flag antennas that is utilized during middle and high band communications.

11. The antenna system of claim 8, wherein a first flag of the first pair of flag antennas is utilized during middle and high band communications and a second flag of the first pair of flag antennas is utilized during low band communications, and wherein a third flag of the second pair of flag antennas is utilized during middle and high band communications and a fourth flag of the second pair of flag antennas is utilized during low band communications.

12. The antenna system of claim 8, wherein the use case configuration is one of a physical use case configuration and a functional use case configuration.

13. The antenna system of claim 12, wherein the physical use case configuration is a physical state of the mobile communication device, and wherein the functional use case configuration is an operational state of the mobile communication device.

14. A communication device, comprising:
a transceiver;
an antenna system coupled with the transceiver, wherein the antenna system includes a first pair of antennas and a second pair of antennas, wherein one of the first or second pairs of antennas are primary antennas and another of the first or second pairs of antennas are diversity antennas, wherein the first pair of antennas have a first single feed point and each antenna in the first pair has first and second ends and the first pair of antennas are connected at the first ends via a first transmission line, and wherein the second pair of antennas have a second single feed point and each antenna in the second pair has first and second ends and are the second pair of antennas are connected at the first ends via a second transmission line;
a matching network coupled with the transceiver and the antenna system, wherein the matching network comprises a tunable reactive element; and
a controller coupled with the matching network, wherein the controller:
detects a use case configuration of the communication device;
obtains a device parameter;
accesses biasing signals and capacitance values from a look-up table stored in memory according to the device parameter and the use case configuration; and
adjusts the tunable reactive element according to the biasing signals and capacitance values in the look-up table to provide impedance tuning.

15. The communication device of claim 14, wherein a first flag of the first pair of antennas is utilized during middle and high band communications and a second flag of the first pair of antennas is utilized during low band communications, and wherein a third flag of the second pair of antennas is utilized during middle and high band communications and a fourth flag of the second pair of antennas is utilized during low band communications.

16. The communication device of claim 14, further comprising an RF switch connected with the antenna system, wherein the RF switch has a first position in which the first pair of antennas are the primary antennas and the second pair of antennas are the diversity antennas, and wherein the RF switch has a second position in which the second pair of antennas are the primary antennas and the first pair of antennas are the diversity antennas.

17. The communication device of claim 16, wherein the controller adjusts the RF switch between the first and second positions according to a determined impedance mismatch.

18. The communication device of claim 14, further comprising a detector coupled with the matching network, wherein the detector measures forward and reverse power at a port of the matching network.

19. The communication device of claim 14, wherein the use case configuration is one of a physical use case configuration and a functional use case configuration.

20. The communication device of claim 19, wherein the physical use case configuration is a physical state of the communication device, and wherein the functional use case configuration is an operational state of the communication device.

* * * * *